US010209800B2

(12) United States Patent
Lim et al.

(10) Patent No.: US 10,209,800 B2
(45) Date of Patent: Feb. 19, 2019

(54) TOUCH SWITCH ATTACHABLE ON WALL

(71) Applicant: CLARUS KOREA CO., LTD., Seoul (KR)

(72) Inventors: Young Taik Lim, Seoul (KR); Tae Kyun Park, Seoul (KR); Ki Bum Kim, Seoul (KR)

(73) Assignee: CLARUS KOREA CO., LTD., Seoul (KR)

( * ) Notice: Subject to any disclaimer, the term of this patent is extended or adjusted under 35 U.S.C. 154(b) by 0 days.

(21) Appl. No.: 15/539,740

(22) PCT Filed: Jun. 1, 2016

(86) PCT No.: PCT/KR2016/005811
§ 371 (c)(1),
(2) Date: Jun. 26, 2017

(87) PCT Pub. No.: WO2017/065377
PCT Pub. Date: Apr. 20, 2017

(65) Prior Publication Data
US 2018/0011574 A1    Jan. 11, 2018

(30) Foreign Application Priority Data

Oct. 14, 2015   (KR) .................. 10-2015-0143200

(51) Int. Cl.
*G06F 3/041* (2006.01)
*H01H 35/00* (2006.01)
(Continued)

(52) U.S. Cl.
CPC ........ *G06F 3/0412* (2013.01); *G02F 1/13338* (2013.01); *G02F 1/133308* (2013.01); *G06F 3/03547* (2013.01); *G06F 3/044* (2013.01); *H01H 35/00* (2013.01); *H03K 17/96* (2013.01); *G02F 2001/133314* (2013.01)

(58) Field of Classification Search
CPC ................... G06F 3/04; H03K 17/96
See application file for complete search history.

(56) References Cited

U.S. PATENT DOCUMENTS 9,389,769 B1 * 7/2016 O'Keeffe .............. G06F 1/3262
2011/0245940 A1   10/2011 Picco
(Continued)

FOREIGN PATENT DOCUMENTS

JP    2005-038796 A    2/2005
JP    2012-174513 A    9/2012
(Continued)

*Primary Examiner* — Joseph R Haley
(74) *Attorney, Agent, or Firm* — Rabin & Berdo, P.C.

(57) ABSTRACT

The present invention provides a touch switch attachable on a wall. The touch switch, attachable on a wall, comprises: a switch box unit which is inserted into an embedded box formed on a wall; a back cover unit which is inserted inside the switch box unit and has a plurality of PCBs stacked and placed; a fixing plate unit which is coupled to the switch box unit and fixes the back cover unit; and an LCD touch pad unit which is fixed on one end of the back cover unit passing through the fixing plate unit, is electrically connected to the plurality of PCBs, and is for inputting switching operation information to the plurality of PCBs by means of capacitive touch.

11 Claims, 10 Drawing Sheets

(51) Int. Cl.
  *H03K 17/96* (2006.01)
  *G02F 1/1333* (2006.01)
  *G06F 3/0354* (2013.01)
  *G06F 3/044* (2006.01)

(56) References Cited

U.S. PATENT DOCUMENTS

2013/0099124 A1* 4/2013 Filson ................ G05D 23/1902
  250/349
2013/0257315 A1 10/2013 Restrepo et al.

FOREIGN PATENT DOCUMENTS

KR        10-0582868  B1   5/2006
KR   20-2011-0011203  U  12/2011

* cited by examiner

TOUCH SWITCH ATTACHABLE ON WALL

TECHNICAL FIELD

The present invention relates to a touch switch attachable to a wall. More particularly, the present invention relates to a touch switch attachable to a wall, the touch switch allowing a user to perform a series of control operations required for switching and control by performing a capacitive touch on a liquid crystal display (LCD) panel and to easily register configuration information of a switch by storing the configuration information using a memory card.

BACKGROUND ART

Commonly, wall-embedded switch units are provided to switch on or off various lighting devices disposed on ceilings or walls. Commonly used switch units include one to six switches.

Korean Patent No. 10-0582868 was disclosed as one of related-art documents related to such a switch unit. As illustrated in FIG. 1 of this patent document, a switching terminal connected to an embedded power cable is fixed to a fixing frame in a switch box embedded in a mold form, a switch plate is inserted thereon, and finally, a switch cover for an on/off touch operation is assembled.

Since most of the switch units must be provided with a switch terminal, i.e. a mechanism structure, including a fixing terminal and a movable terminal to control a lighting device, for every switch terminal, the switch units include one to six switches.

Recently, in order to reduce the number of apparatuses associated with a switching operation, a method for performing touch control using a liquid crystal display (LCD) has been developed.

However, a general program switch has a problem in that since a high supply current up to about 13 mA, as well as high energy, is required for the user operation.

DISCLOSURE

Technical Problem

Accordingly, the present invention has been made keeping in mind the above problems occurring in the related art, and an object of the present invention is to provide a touch switch attachable to a wall. More particularly, the present invention provides a touch switch attachable to a wall, the touch switch allowing a user to perform a series of control operations required for switching and control by performing a capacitive touch on a liquid crystal display (LCD) panel and to easily register configuration information of a switch by storing the configuration information using a memory card.

Technical Solution

In order to accomplish the above object, the present invention provides a touch switch attachable to a wall.

The touch switch attachable to a wall may include: a switch box unit inserted into an embedded box formed in a wall; a back cover unit inserted into the switch box unit, with a plurality of printed circuit boards (PCBs) stacked on each other being disposed therein; a fixing plate unit coupled to the switch box unit and fixing the back cover unit; and a liquid crystal display (LCD) touch pad unit fixedly installed on one end of the back cover unit penetrating the fixing plate unit, electrically connected to the plurality of PCBs, and inputting switching driving information to the plurality of PCBs in a capacitive touch method.

The LCD touch pad unit may include: a main PCB fixed on the fixing plate unit and electrically connected to the plurality of PCBs, with removable memory being inserted thereinto; an LCD panel electrically connected to the main PCB to transfer an input signal to the main PCB in the capacitive touch method; a bezel coupled to an edge of the fixing plate unit to fix an edge of the LCD; and a rubber packing sealing the bezel and the edge of the LCD.

The main PCB may have a memory insertion portion formed therein, and removable memory is inserted into the memory insertion portion and is electrically connected to the plurality of PCBs.

A through-hole and a support part may be formed in the fixing plate unit, the back cover unit extending through the through-hole, and the support part extending from an inner peripheral surface of the through-hole and supporting an external surface of the back cover unit.

To perform wired or wireless communication, the plurality of PCBs may use any one of a Zigbee communication system and an easy control full-2 way lighting control system (E/F2).

Alternatively, both the Zigbee communication system and the E/F2 may be used while being combined through a gateway.

Advantageous Effects

As described above, according to the present invention, a user can simply input a series of control operations required for switching and control, and configure a variety of control screens using an LCD touch pad unit, perform control over use or non-use by adjusting screen brightness of the LCD touch pad unit, thereby efficiently saving energy.

In addition, according to the present invention, a switch can be controlled based on a capacitive touch and configuration information of the switch can be stored using a memory card, so that the convenience of maintenance can be provided.

BEST MODE

The present invention relates to a touch switch attachable to a wall including a switch box unit inserted into an embedded box formed in a wall; a back cover unit inserted into the switch box unit, with a plurality of printed circuit boards (PCBs) stacked on each other being disposed therein; a fixing plate unit coupled to the switch box unit to support an external surface of the back cover unit penetrating the fixing plate unit; and an LCD touch pad unit coupled to one end of the back cover unit penetrating the fixing plate unit and electrically connected to the plurality of PCBs, wherein the LCD touch pad unit inputs switching driving information to the plurality of PCBs in a capacitive touch method.

A through-hole and a support part are formed in the fixing plate unit, the back cover unit extending through the through-hole, and the support part extending from an inner peripheral surface of the through-hole to support the external surface of the back cover unit.

The LCD touch pad unit has a structure in which a bezel, a main PCB, and an LCD are sequentially stacked. The bezel has one end on which a fixing plate coupling part connected to the fixing plate unit is disposed, and the other end having a groove accommodating the main PCB and the LCD. The main PCB is electrically connected to the plurality of PCBs, and removable memory is inserted into the main PCB. The LCD is electrically connected to the main PCB to transfer an input signal to the main PCB in a capacitive touch method.

MODE FOR INVENTION

Hereinafter, a touch switch attachable to a wall according to the present invention will be described with reference to the accompanying drawings.

Figure 1:
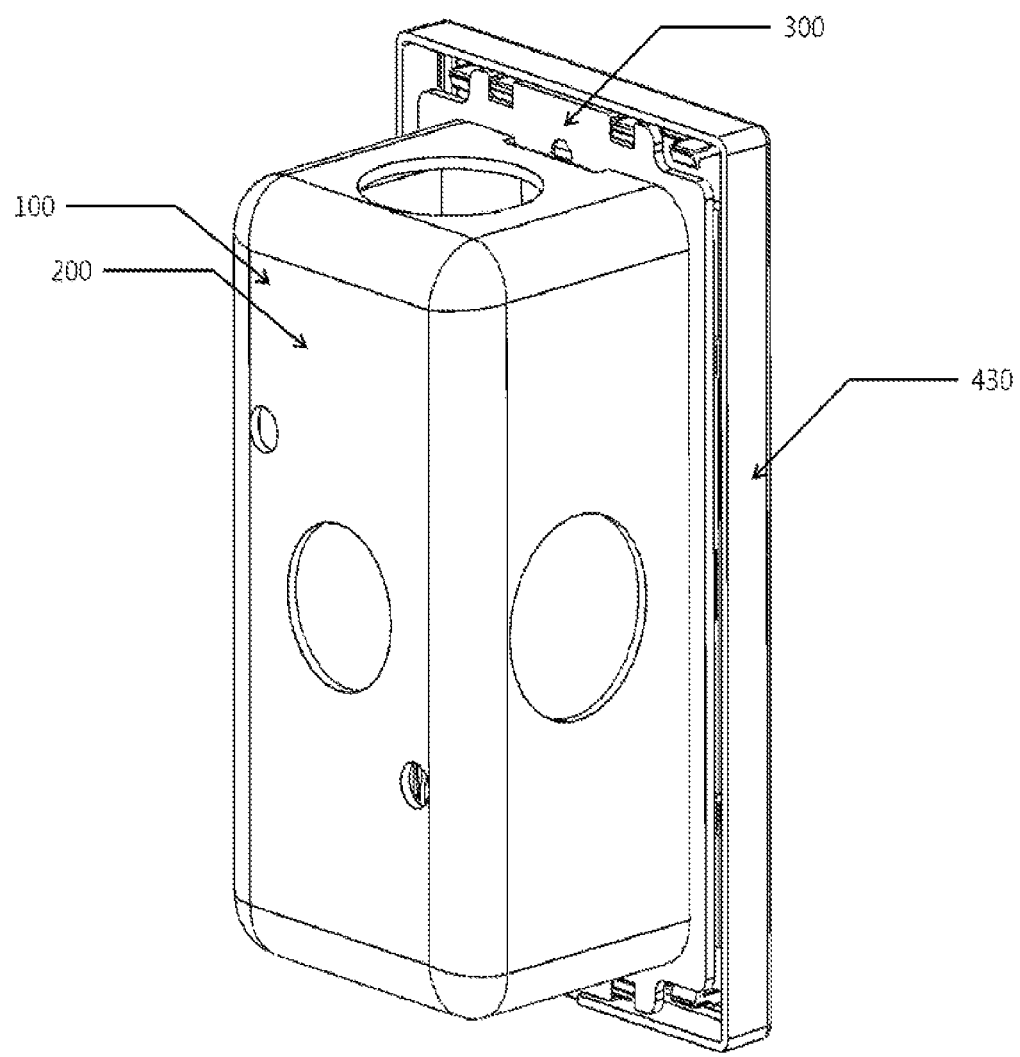
FIG. 1 is an assembled perspective view illustrating a touch switch attachable to a wall according to the present invention.
Figure 2:
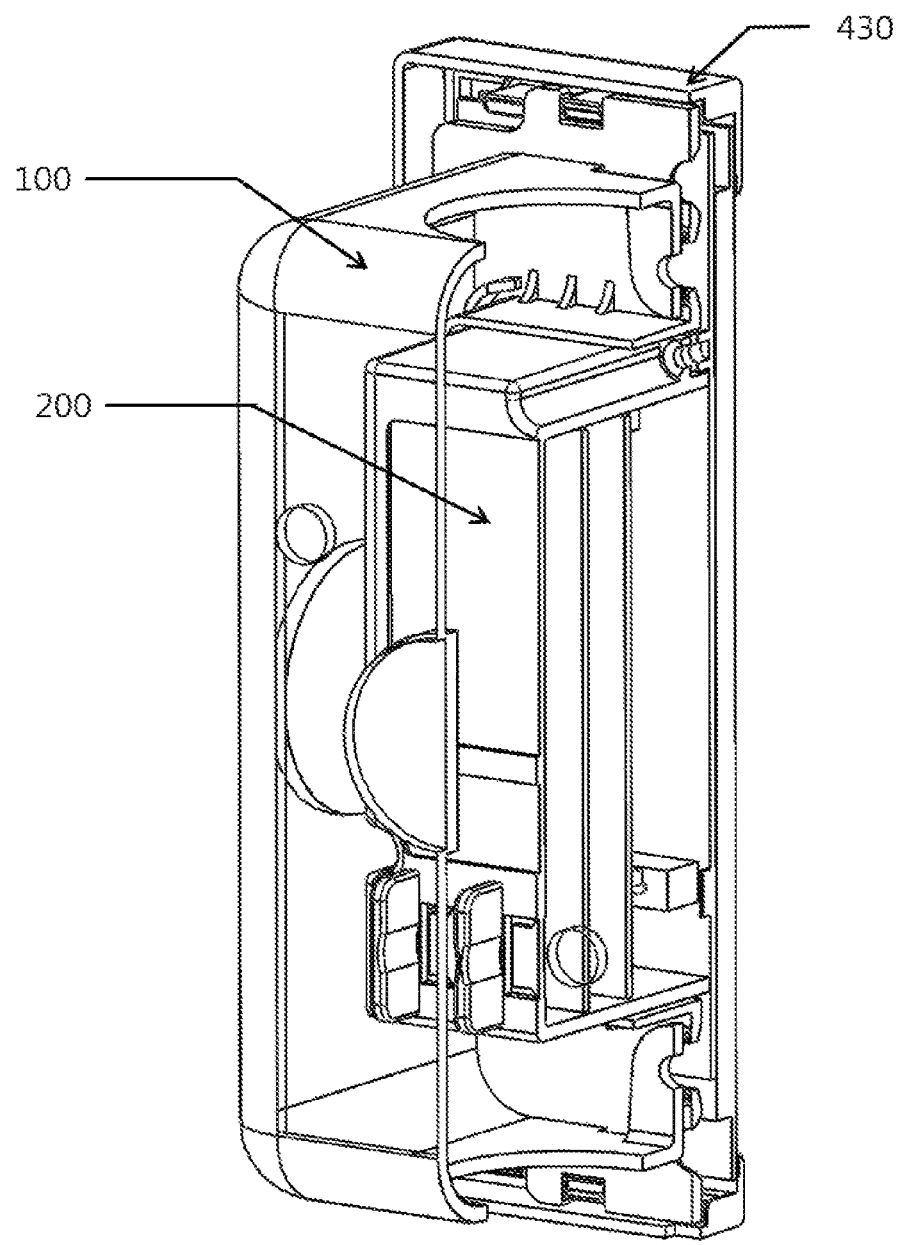
FIG. 2 is a view illustrating a side surface of the assembled touch switch attachable to a wall according to the present invention coupled.
Figure 3:
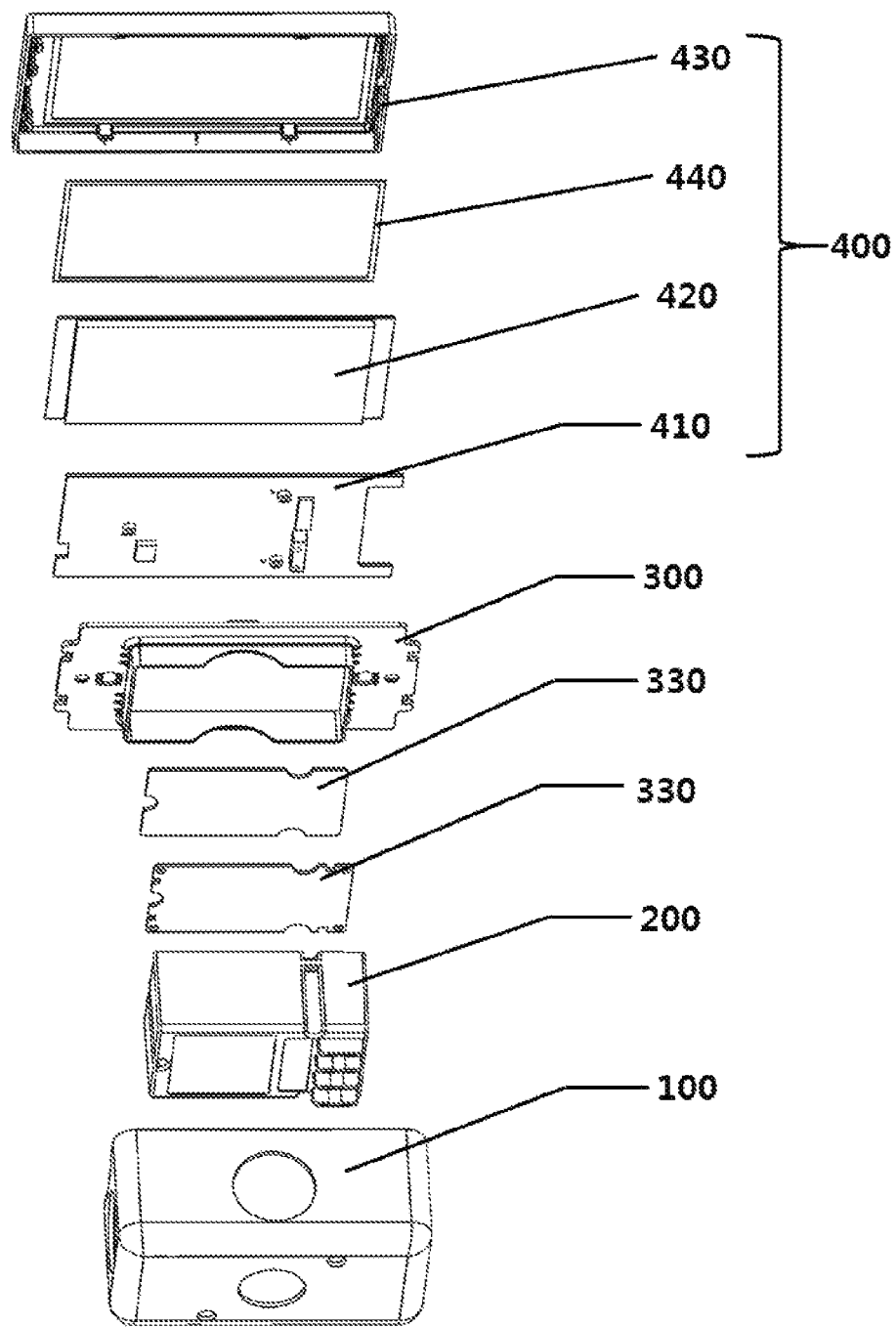
FIG. 3 is an exploded prospective view illustrating the touch switch attachable to a wall according to the present invention.
Figure 4:
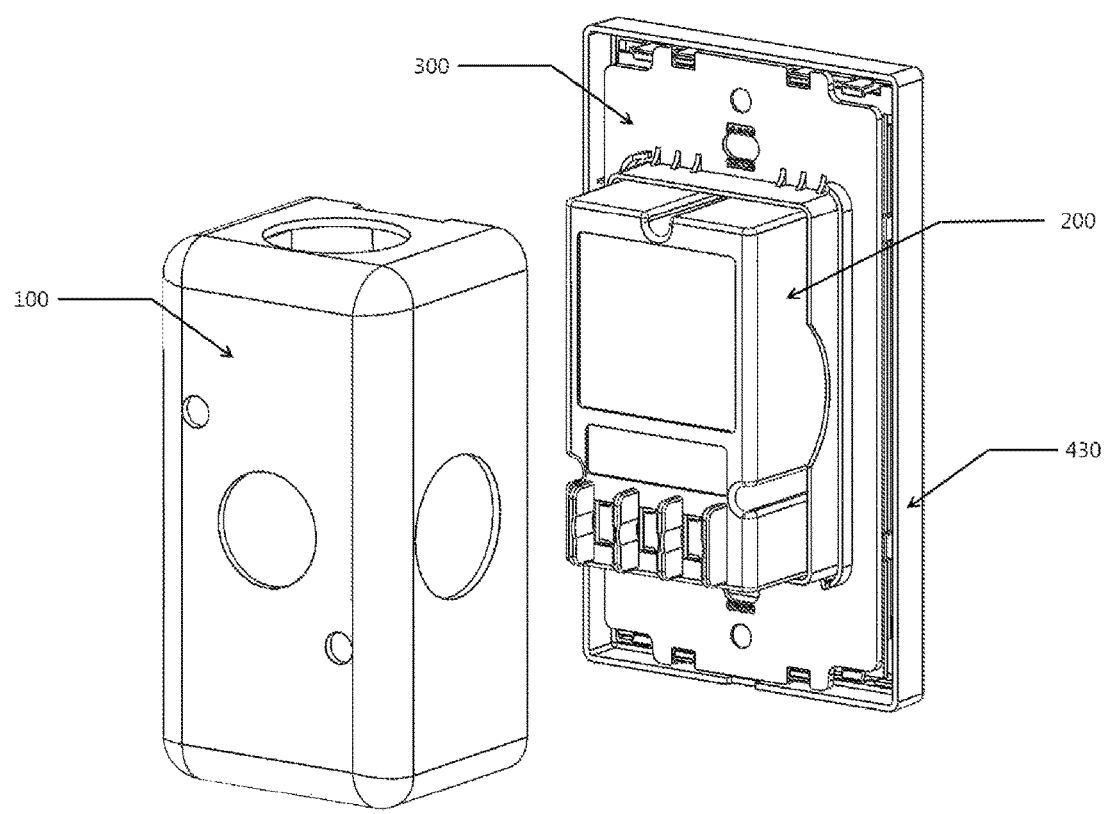
FIG. 4 is another exploded prospective view illustrating the touch switch attachable to a wall according to the present invention.
Figure 5:
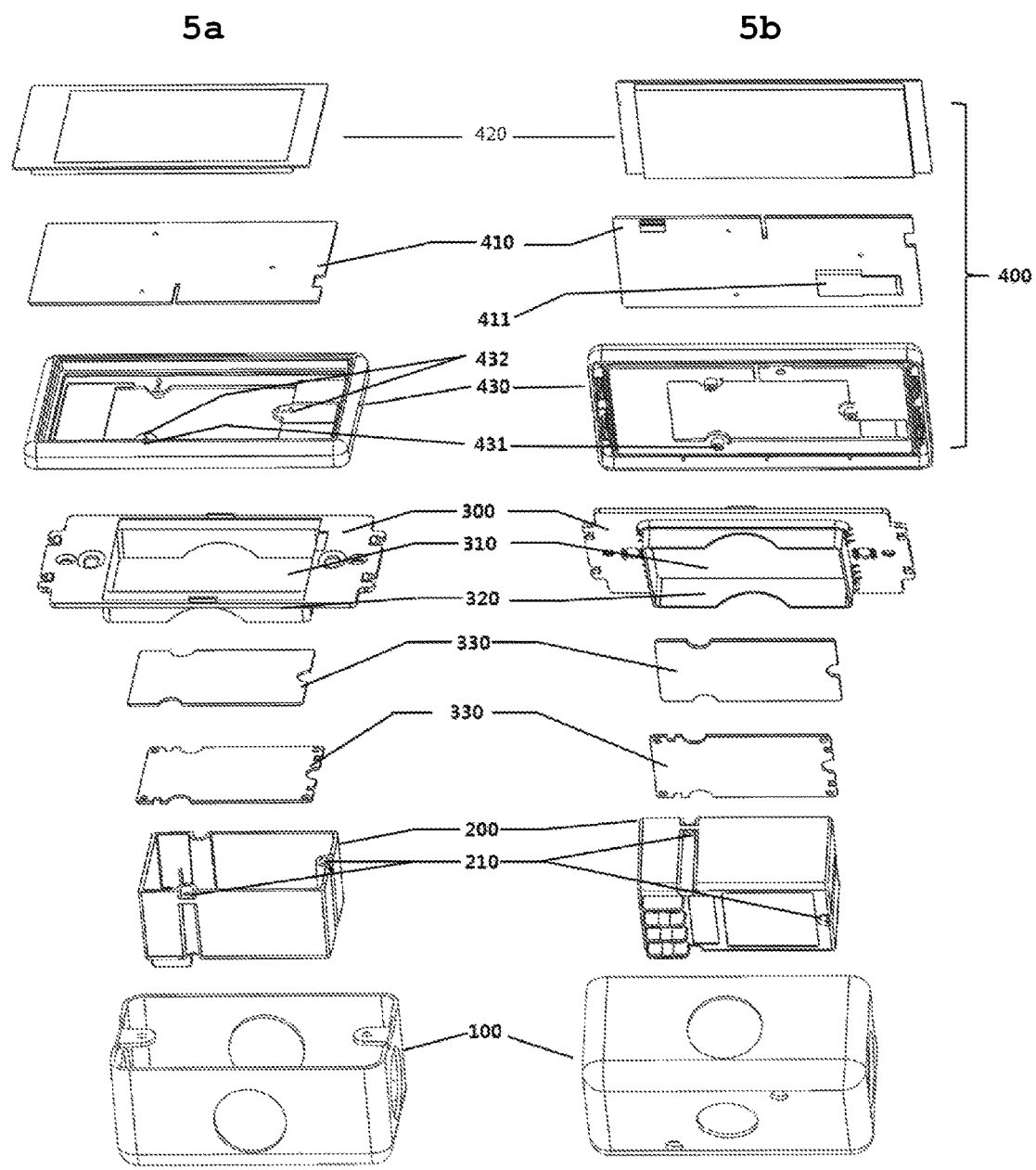
FIG. 5 is a perspective view illustrating a touch switch attachable to a wall according to another embodiment of the present invention.
Figure 6:
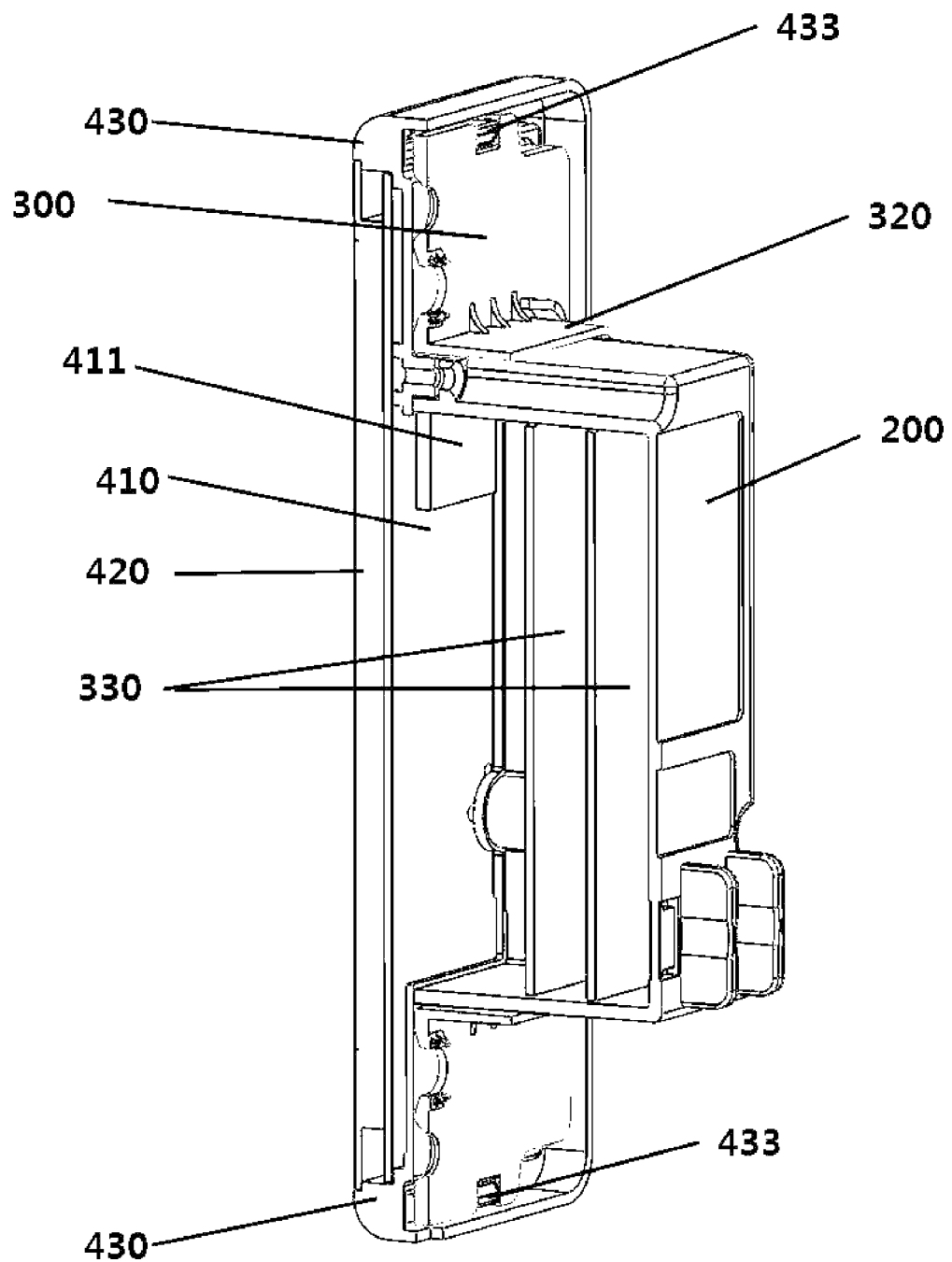
FIG. 6 is an assembled cross-sectional view illustrating the touch switch attachable to a wall illustrated in FIG. 5, according to another embodiment of the present invention.
Figure 7:
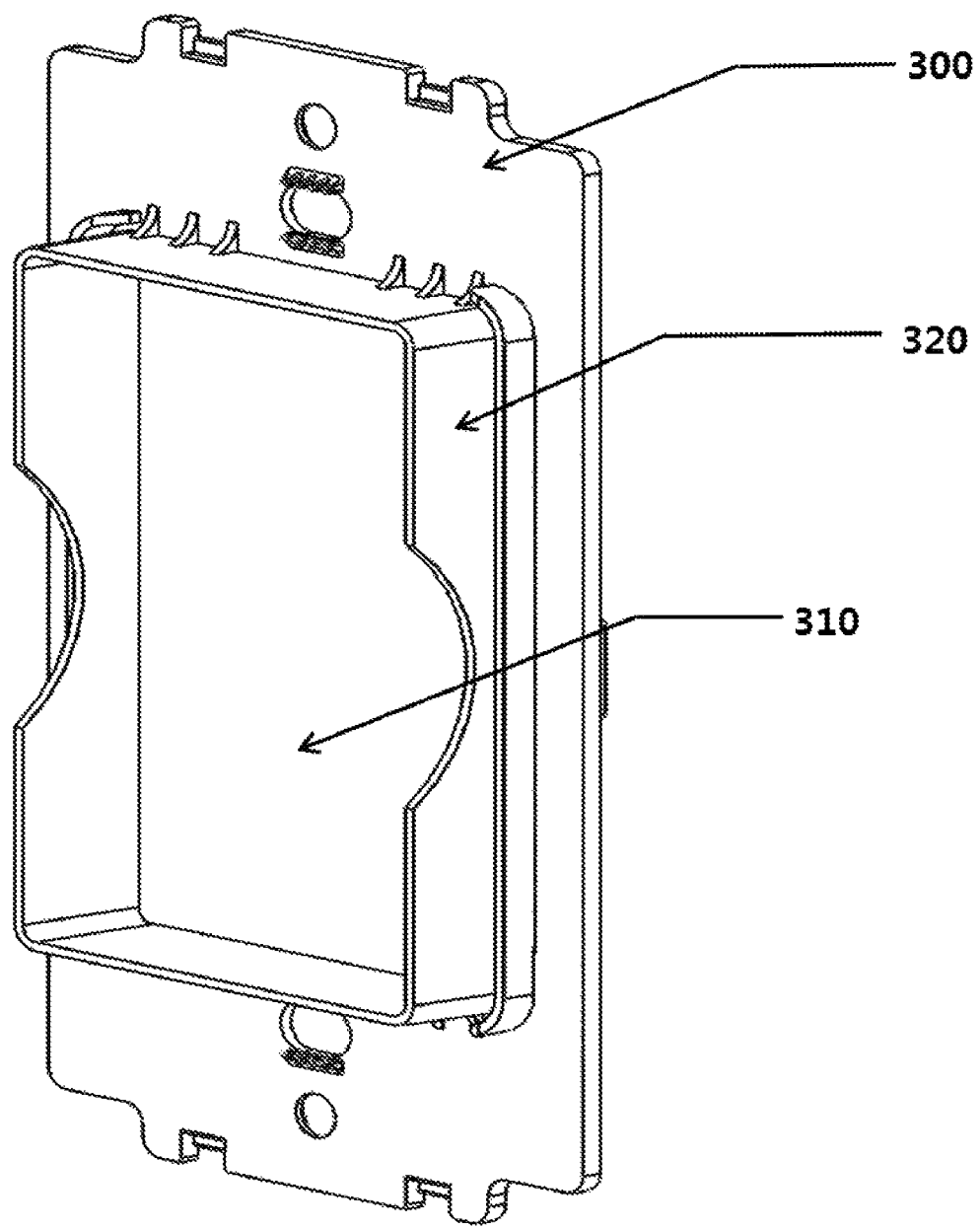
FIG. 7 is a perspective view illustrating a fixing plate unit according to the present invention.
Figure 8:
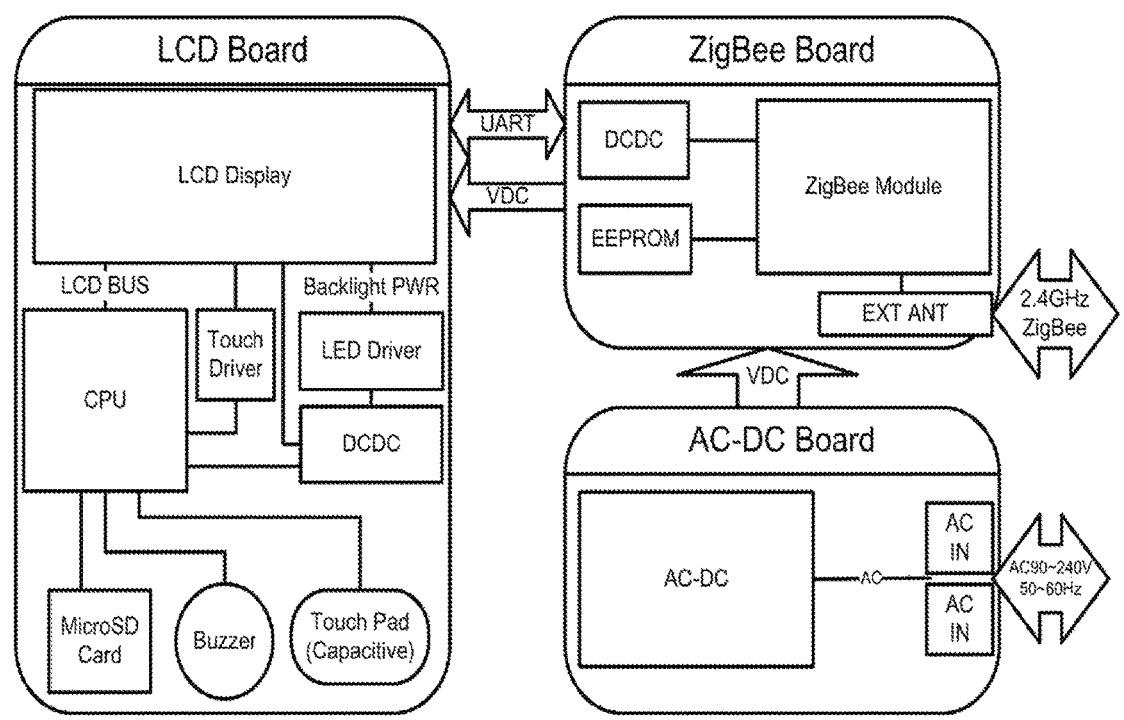
FIG. 8 is a block diagram illustrating an application in which a Zigbee communication system is associated with the touch switch attachable to a wall according to the present invention.
Figure 9:
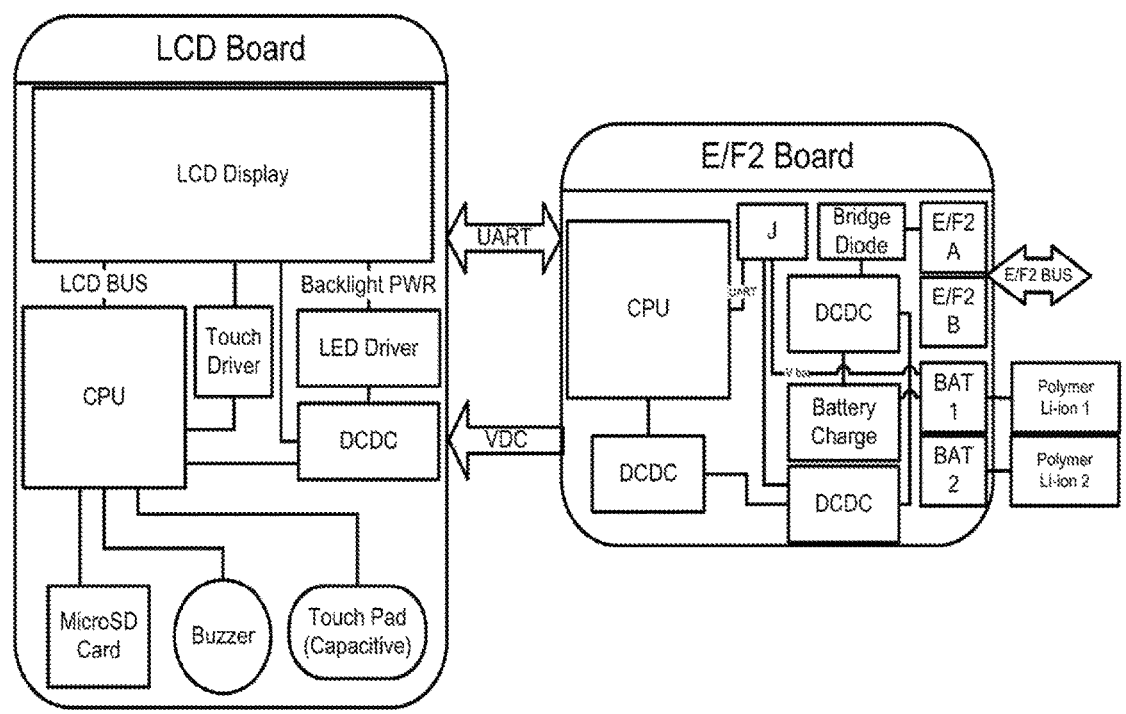
FIG. 9 is a block diagram illustrating an application in which an easy control full-2 way lighting control system (E/F2) is associated with the touch switch attachable to a wall according to the present invention.
Figure 10:
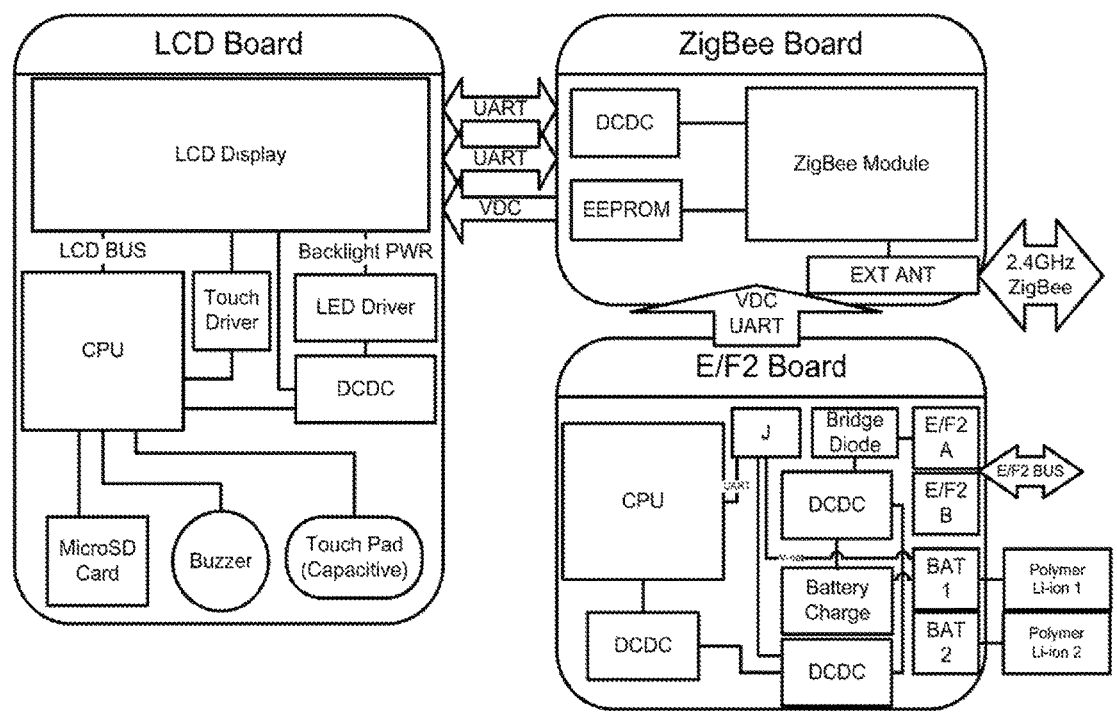
FIG. 10 is a block diagram illustrating an application in which a Zigbee communication system and an E/F2 are combined though a gateway and are associated with the touch switch attachable to a wall according to the present invention.

FIG. 1 is an assembled perspective view illustrating a touch switch attachable to a wall according to the present invention, FIG. 2 is a view illustrating a side surface of the assembled touch switch attachable to a wall according to the present invention coupled, FIG. 3 is an exploded prospective view illustrating the touch switch attachable to a wall according to the present invention, FIG. 4 is another exploded prospective view illustrating the touch switch attachable to a wall according to the present invention, FIG. 5 is a perspective view illustrating a touch switch attachable to a wall according to another embodiment of the present invention, FIG. 6 is an assembled cross-sectional view illustrating the touch switch attachable to a wall illustrated in FIG. 5, according to another embodiment of the present invention, FIG. 7 is a perspective view illustrating a fixing plate unit according to the present invention, FIG. 8 is a block diagram illustrating an application in which a Zigbee communication system is associated with the touch switch attachable to a wall according to the present invention, FIG. 9 is a block diagram illustrating an application in which an easy control full-2 way lighting control system (E/F2) is associated with the touch switch attachable to a wall according to the present invention, and FIG. 10 is a block diagram illustrating an application in which a Zigbee communication system and an E/F2 are combined though a gateway and are associated with the touch switch attachable to a wall according to the present invention.

Referring to FIGS. 1 and 2, the touch switch attachable to a wall according to the present invention generally includes a switch box unit 100, a back cover unit 200, a fixing plate unit 300, and a liquid crystal display (LCD) touch pad unit 400.

Referring to FIGS. 3 and 4, the switching box unit 100 according to the present invention has a space formed therein and is formed such that one side thereof is opened.

The switching box unit 100 is formed of a metal.

The switching box unit 100 can be inserted into and fixed to an embedded box (not shown) installed in a wall.

The back cover unit 200 has a space formed therein, with one side being open.

The back cover unit 200 may be disposed in an inner space of the switch box unit 100. One end of the back cover unit 200 protrudes outward from the switch box unit 100.

Two printed circuit boards (PCBs) 330 are disposed in the inner space of the back cover unit 200. The two PCBs 330 may be stacked on each other.

The two PCBs 330 can perform a control operation when a switching operation is performed.

The Two PCBs 330 can be hung on a stepped portion of an inner sidewall of the back cover unit 200 and can be fixed through a coupling member such as a bolt.

On the other hand, the fixing plate unit 300 according to the present invention is coupled to one end of the switch box unit 100.

A through-hole 310 is formed in a center of the fixing plate unit 300.

The through-hole 310 may be formed as a hole having the same shape as the appearance of the back cover unit 200.

In addition, a support part 320 extends from an inner peripheral surface of the through-hole 310 to the inner space of the switch box unit 100.

Here, the aforementioned back cover unit 200 extends through the through-hole 310 of the fixing plate unit 300 and closely contacts the support part 320 extending from the inner peripheral surface of the through-hole 310, such that the back cover unit 200 can be easily fixed.

Therefore, one end of the back cover unit 200 protrudes outward from the fixing plate unit 300, and the other end of the back cover unit 200 is disposed in the inner space of the switch box unit 100.

The LCD touch pad unit 400 according to the present invention is fixed to one end of the back cover unit 200.

The LCD touch pad unit 400 is electrically connected to a plurality of PCBs 330.

Switching driving information is input to the plurality of PCBs 330 in a capacitive touch method.

The LCD touch pad unit 400 includes a main PCB 410, an LCD panel 420, a bezel 430, and a rubber packing 440.

One surface of the main PCB 410 is fixed to one end of the back cover unit 200 through a coupling member.

An area of the main PCB 410 is wider than that of the one end of the back cover unit 200.

A memory insertion portion 411 is formed in one surface of the main PCB 410, such that removable memory (SD, not shown) can be inserted into the memory insertion portion 411 and can be electrically connected to the plurality of PCBs 330.

The removable memory may pre-store, or change and store configuration information of content, a tag, a node, or the like, required for a switch operation.

The configuration information stored in the removable memory can be transferred to the main PCB 410.

In addition, since the removable memory is attachable to and detachable from the memory insertion unit 411, operation easiness may be secured when an operator maintains or upgrades firmware.

The LCD panel 420 is electrically connected to the main PCB 410 and transfers an input signal to the main PCB 410 in the capacitive touch method.

The LCD panel 420 can display various configuration screens, and a user can input a corresponding switching command with a finger using the configuration screens, causing the corresponding switching command to be transferred to the main PCB and the plurality of PCBs so that a switching operation is performed.

The bezel 430 is coupled to an edge of the fixing plate unit 330 so as to fix an edge of the LCD panel 420.

In addition, the rubber packing 440 sealing the edge of the LCD panel 420 can maintain a seal between the bezel 430 and the LCD panel 420.

On the other hand, FIGS. 5 and 6 illustrate a touch pad unit 400 according to another embodiment of the present invention having a different configuration and placement order from the touch pad unit 400 of the touch switch attachable to a wall illustrated in FIGS. 3 and 4.

The touch pad unit 400 of FIG. 3 has a structure in which the main PCB 410, the LCD panel 420, the rubber packing 440, and the bezel 430 are sequentially coupled on the fixing plate unit 300, whereas the touch pad unit 400 of FIG. 5 according to another embodiment of the present invention of FIG. 5 has a structure in which a bezel 430, a main PCB 410, and an LCD panel 420 are sequentially coupled on the fixing plate unit 300.

That is, as illustrated in FIGS. 5 and 6, the touch switch attachable to a wall includes: a switch box unit 100 inserted into an embedded box formed in a wall; a back cover unit 200 inserted into the switch box unit 100, with a plurality of PCBs 330 stacked on each other being disposed in the back cover unit 200; a fixing plate unit 300 coupled to the switch box unit 100 to support an external surface of the back cover unit 300 penetrating the fixing plate unit 300; and the LCD touch pad unit 400 coupled to one end of the back cover unit 200 penetrating the fixing plate unit 300, electrically connected to the plurality of PCBs 330, and inputting switching driving information to the plurality of PCBs 330 in a capacitive touch method.

A through-hole 310 and a support part 320 are formed in the fixing plate unit 300. The back cover unit 200 extends through the through-hole 310, and the support part 320 extends from an inner peripheral surface of the through-hole 310 to support an external surface of the back cover unit 200.

The LCD touch pad unit 400 has a structure in which the bezel 430, the main PCB 410, and the LCD panel 420 are sequentially stacked.

The bezel 430 has a fixing plate unit coupling part 433 through which one end thereof is coupled to the fixing plate unit 300, and a bezel bolt hole 431 so as to be coupled to one end of the back cover unit 200 through a bolt (not shown). In addition, the bezel 430 has the other end in which a groove accommodating the main PCB 410 and the LCD panel 420 is formed, and includes a plurality of main PCB separation pins 432 to maintain a predetermined distance from the main PCB 410.

The main PCB 410 is electrically connected to the plurality of PCBs 330, and an area of the main PCB 410 is wider than that of one end of the back cover unit 200. A memory insertion portion 411 may be formed in one surface of the main PCB 410, removable memory (SD, not shown) being inserted into the memory insertion portion 411 and being electrically connected to the plurality of PCBs 330. The removable memory can pre-store or change and store configuration information of content, a tag, a node, or the like required for a switch operation. The configuration information stored in the removable memory can be transferred to the main PCB 410. In addition, since the removable memory is attachable to or detachable from the memory insertion unit 411, the ease of operations may be obtained when an operator maintains or upgrades firmware.

The LCD panel 420 has a function for transferring an input signal to the main PCB in a capacitive touch method.

The LCD panel 420 may display various configuration screens, and a user may input a corresponding switching command with a finger through the configuration screens and transfer the corresponding switching command to the main PCB and the plurality of PCBs so that a switching operation is performed.

Components illustrated in FIG. 5, i.e. the switch box unit 100, the back cover unit 200, the plurality of PCBs 330, and the fixing plate unit 300, have the same structure and placement order as those illustrated in FIG. 3. The back cover unit 200 according to another embodiment of the present invention extends through the through-hole 310 of the fixing plate unit 300 and stably supports the back cover unit 200 by closely contacting a side surface of the back cover unit 200 through the support part 320 extending from the inner peripheral surface of the through-hole 310.

As illustrated in FIG. 6, one end of the back cover unit 200 has a structure coupled to protrude outward from the bezel 430 and the other end thereof is disposed in an inner space of the switch box unit 100. The back cover unit 200 and the bezel 430 have a plurality of back cover bolt holes 210 and a plurality of bezel holes 431. The back cover unit 200 and the bezel 430 are configured to be brought to each other according to the corresponding shapes thereof and then to be coupled to each other using bolts.

The LCD touch pad unit 400 is electrically connected to the plurality of PCBs 330, and switching driving information is input to the plurality of PCBs 330 in a capacitive touch method.

The LCD touch pad unit 400 includes the main PCB 410, the LCD panel 420, and the bezel 430, which are coupled through a coupling means such as a double-sided adhesive tape, an adhesive, a nut, or the like.

In addition, a sealing rubber packing may also be installed on the bezel 430 and an edge of the LCD panel 420 as illustrated in FIG. 3 to maintain a seal.

On the other hand, referring to FIGS. 8 to 10, the touch switch attachable to a wall according to the present invention may be a switch using a capacitive touch pad thin fill transistor (TFT) LCD, the switch being able to selectively use one of the Zigbee communication system and the E/F2 or use a combination of the Zigbee communication system and the E/F2 combined through a gateway.

This allows lighting to be wirelessly controlled through a Zigbee device provided in the touch switch attachable to a wall, and also allows communication with a main controller and a control device and power to be supplied thereto through access to the E/F2.

In response to the E/F2 and the Zigbee communication system, wired and wireless devices can be controlled through an address terminal unit.

Therefore, various lighting control scenes can be set using an E/F2 network, and group setting can be performed using a DALI network.

In particular, the touch switch attachable to a wall according to the present invention can independently select or combine the Zigbee communication system and the E/F2 to perform on/off control or dimming control of lighting devices according to the service environment.

In addition, a button attribute, a screen configuration, and an operation function can be edited in a PC through a touch LCD switch editor and a simulator of the touch switch attachable to a wall, and the button attribute, the screen configuration, and the operation function can be stored a removable memory card (SD card) and be stored in a touch LCD switch (TLS). This is to provide a user-friendly editing function.

A user may apply a scenario based on timed-based lighting color-temperature setting (morning/evening warm white and daytime cool white) to a lighting device and operate the lighting device by easily constituting group control/individual control of the lighting device on a switch screen through such a function. The user may perform such an operation using a button to display the operation on a touch LCD switch (TLS) screen.

A switch controlling a lighting device may be used in plural due to necessity of a user and a limitation of a circuit configuration in an inner space. In this case, in order to solve a problem that the user has a difficulty in finding a switch interworking with the lighting device, the touch switch attachable to a wall according to the present invention may distinguish a lighting device by displaying a plan view of a building on a touch LCD switch (TLS) screen and may explicitly perform individual control.

In addition, according to the present invention, there may be a problem that power consumption is rapidly increased when power is supplied to a driving device and a backlight unit of an LCD through an E/F2, but a trickle charge function may be used through a power storage device (battery), a charging circuit, and a keying circuit. Charging is performed by performing a trickle function during a slim mode by adding a battery cell, and energy stored in the battery is used during an LCD touch operation and a monitoring function, thereby further saving energy.

High supply current and energy are required when a user performs an LCD screen touch. However, since a substantial operation time of the user is short, instantly generated supply current and energy are only required. Accordingly, when the user performs the LCD screen touch by performing a trickle charge function, system power is not used and current stored in the battery is used, i.e. an auxiliary battery is used, thereby maintaining a stable system power state. At the same time, when a sleep function is performed, charging is performed with a diminutive current by performing the trickle charge, thereby saving energy.

Since a general touch switch operation complexly involves many functions, supply current is high. However, since a finger touch according to the present invention performs a simple function, a very small amount of current is used during the operation, thereby saving energy. Although not shown in the drawings, three finger touch buttons in addition to the an LCD touch are disposed in the LCD touch pad unit 400, and thus, in a situation in which a user operation is required when a sleep function is performed, a wakeup function is performed through a finger touch to perform the wakeup function with low supply current and an easy operation, and a picture, content, a tag setting screen movement of several scenes set by the user may be easily used as in a smartphone.

In addition, the LCD touch pad unit 400 includes a backlight unit providing LCD light, and the backlight unit may variably adjust a lighting level in a set range on a command window visualized in an LCD through a capacitive touch and may enable the LCD window at the time of a touch response.

According to embodiments of the present invention, through the configuration and the operation described above, contents of a screen required for a switching control operation may be composed on an LCD using a switching driving program, and a tag about a picture file and a tag about a node may be registered through removable memory.

In addition, according to embodiments of the present invention, information on content, a tag, or a node may be produced in a PC to store the information in removable memory, thereby simply registering the information.

In addition, according to embodiments of the present invention, several screen configurations may be composed on an LCD, thereby controlling one of the several screen configurations and performing a complex function.

Furthermore, according to embodiments of the present invention, a capacitive touch pad may be used to enable an operation when a user touch is sensed, thereby efficiently saving energy.

While the touch switch attachable to a wall according to the present invention has been described with reference to some embodiments, it will be apparent to those skilled in the art that various modifications can be made without departing from the spirit and scope of the invention.

Therefore, the scope of the invention should be limited only by the accompanying claims and equivalents thereof.

In other words, it should be understood that these embodiments are given by way of illustration only and do not limit the scope of the present invention, and that various modifications, variations, and alterations can be made without departing from the spirit and scope of the invention defined only by the accompanying claims and equivalents thereof.

What is claimed is:
1. A touch switch attachable to a wall, comprising:
   a switch box unit inserted into an embedded box formed in a wall;
   a back cover unit inserted into the switch box unit, with a plurality of printed circuit boards (PCBs) stacked on each other being disposed therein;
   a fixing plate unit coupled to the switch box unit and fixing the back cover unit; and
   a liquid crystal display (LCD) touch pad unit fixedly installed on one end of the back cover unit penetrating the fixing plate unit, electrically connected to the plurality of PCBs, and inputting switching driving information to the plurality of PCBs in a capacitive touch method,
   wherein a through-hole and a support part are formed in the fixing plate unit, the back cover unit extending through the through-hole, and the support part extending from an inner peripheral surface of the through-hole and supporting an external surface of the back cover unit, and
   wherein the LCD touch pad unit comprises: a main PCB fixed on the fixing plate unit and electrically connected to the plurality of PCBs, with removable memory being inserted thereinto; an LCD panel electrically connected to the main PCB to transfer an input signal to the main PCB in the capacitive touch method; a bezel coupled to an edge of the fixing plate unit to fix an edge of the LCD; and a rubber packing sealing the bezel and the edge of the LCD.

2. A touch switch attachable to a wall, comprising:
a switch box unit inserted into an embedded box formed in a wall;
a back cover unit inserted into the switch box unit, with a plurality of PCBs stacked on each other being disposed therein;
a fixing plate unit coupled to the switch box unit to support an external surface of the back cover unit penetrating the fixing plate unit; and
an LCD touch pad unit coupled to one end of the back cover unit penetrating the fixing plate unit, electrically connected to the plurality of PCBs, and inputting switching driving information to the plurality of PCBs in a capacitive touch method,
wherein a through-hole and a support part are formed in the fixing plate unit, the back cover unit extending through the through-hole, and the support part extending from an inner peripheral surface of the through-hole and supporting an external surface of the back cover unit, and
wherein the LCD touch pad unit has a structure in which a bezel, the main PCB, and the LCD are sequentially stacked, and
wherein the bezel has one end on which a fixing plate coupling part connected to the fixing plate unit is disposed, and the other end having a groove accommodating the main PCB and the LCD.

3. The touch switch of claim 2, wherein the main PCB is electrically connected to the plurality of PCBs, and the LCD transfers an input signal to the main PCB in the capacitive touch method.

4. The touch switch of claim 1, wherein the main PCB has a memory insertion portion formed therein, and removable memory is inserted into the memory insertion portion and is electrically connected to the plurality of PCBs.

5. The touch switch of claim 1, wherein to perform wired or wireless communication, the plurality of PCBs uses any one of a Zigbee communication system and a full-2 way lighting control system (E/F2).

6. The touch switch of claim 5, wherein both the Zigbee communication system and the full-2 way lighting control system (E/F2) are used while being combined through a gateway.

7. The touch switch of claim 3, wherein the bezel has main PCB separation pins to maintain a predetermined distance from the main PCB.

8. The touch switch of claim 3, wherein one surface of the main PCB is coupled to one end of the LCD through a coupling means selected from a double-sided adhesive tape, an adhesive, and a nut.

9. The touch switch of claim 3, wherein the main PCB has a memory insertion portion formed therein, and removable memory is inserted into the memory insertion portion and is electrically connected to the plurality of PCBs.

10. The touch switch of claim 3, wherein to perform wired or wireless communication, the plurality of PCBs uses any one of a Zigbee communication system and a full-2 way lighting control system (E/F2).

11. The touch switch of claim 10, wherein both the Zigbee communication system and the full-2 way lighting control system (E/F2) are used while being combined through a gateway.

* * * * *